United States Patent
Aust et al.

(10) Patent No.: US 11,508,595 B2
(45) Date of Patent: Nov. 22, 2022

(54) APPARATUS AND METHOD FOR CONTACTLESS TRANSPORTATION OF A DEVICE IN A VACUUM PROCESSING SYSTEM

(71) Applicants: Applied Materials, Inc., Santa Clara, CA (US); Henning Aust, Mühltal (DE); Jörg Schuler, Wiesbaden (DE)

(72) Inventors: Henning Aust, Mühltal (DE); Jörg Schuler, Wiesbaden (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 374 days.

(21) Appl. No.: 16/302,609

(22) PCT Filed: Aug. 24, 2017

(86) PCT No.: PCT/EP2017/071362
§ 371 (c)(1),
(2) Date: Nov. 16, 2018

(87) PCT Pub. No.: WO2019/037858
PCT Pub. Date: Feb. 28, 2019

(65) Prior Publication Data
US 2021/0225677 A1    Jul. 22, 2021

(51) Int. Cl.
*H01L 21/677* (2006.01)
*B60L 13/04* (2006.01)
(Continued)

(52) U.S. Cl.
CPC ........ *H01L 21/67709* (2013.01); *B60L 13/04* (2013.01); *B65G 43/00* (2013.01);
(Continued)

(58) Field of Classification Search
CPC .......... H01L 21/67709; H01L 21/6715; H01L 21/67259; H01L 21/67715;
(Continued)

(56) References Cited

U.S. PATENT DOCUMENTS

| 4,690,066 A | 9/1987 | Morishita et al. |
| 5,377,596 A | 1/1995 | Ono et al. |

(Continued)

FOREIGN PATENT DOCUMENTS

| DE | 1020147005547 | 10/2015 |
| WO | 2016087005 A1 | 6/2016 |

OTHER PUBLICATIONS

International Search Report and Written Opinion dated May 17, 2018 for Application No. PCT/EP2017/071362.
Taiwan Office Action dated Jul. 3, 2019 for Application No. 107129317.

*Primary Examiner* — Thomas Randazzo
(74) *Attorney, Agent, or Firm* — Patterson + Sheridan, LLP

(57) ABSTRACT

An apparatus for contactless transportation of a device in a vacuum processing system is described. The apparatus includes: a magnetic transportation arrangement for providing a magnetic levitation force ($F_L$) for levitating the device, the magnetic transportation arrangement comprising one or more active magnetic units; a sensor for monitoring a motion of the device, and a controller configured for controlling the one or more active magnetic units based on a signal provided by the sensor.

20 Claims, 5 Drawing Sheets

(51) Int. Cl.
  *B65G 54/02* (2006.01)
  *C23C 14/54* (2006.01)
  *C23C 14/56* (2006.01)
  *B65G 43/00* (2006.01)
  *C23C 14/50* (2006.01)
  *H01L 21/67* (2006.01)
  *H01L 21/687* (2006.01)
  *H01L 51/56* (2006.01)
  *B61B 13/00* (2006.01)

(52) U.S. Cl.
  CPC .............. *B65G 54/02* (2013.01); *C23C 14/50* (2013.01); *C23C 14/54* (2013.01); *C23C 14/564* (2013.01); *C23C 14/568* (2013.01); *H01L 21/6715* (2013.01); *H01L 21/67259* (2013.01); *H01L 21/67715* (2013.01); *H01L 21/68742* (2013.01); *B61B 13/00* (2013.01); *B65G 2201/02* (2013.01); *H01L 51/56* (2013.01)

(58) Field of Classification Search
  CPC .... H01L 21/68742; H01L 51/56; B60L 13/04; B65G 43/00; B65G 54/02; B65G 2201/02; C23C 14/50; C23C 14/54; C23C 14/564; C23C 14/568; B61B 13/00
  See application file for complete search history.

(56) References Cited

U.S. PATENT DOCUMENTS

| | | | |
|---|---|---|---|
| 5,485,910 A * | 1/1996 | Oda ..................... | B65G 54/025 198/690.1 |
| 5,641,054 A * | 6/1997 | Mori ................. | H01L 21/67184 198/465.1 |
| 6,183,615 B1 * | 2/2001 | Yasar ................ | H01L 21/67709 204/192.12 |
| 6,361,268 B1 * | 3/2002 | Pelrine ............. | H01L 21/67709 414/749.2 |
| 2008/0029368 A1 * | 2/2008 | Komori .................. | B61B 13/08 198/619 |
| 2015/0122180 A1 | 5/2015 | Chang et al. | |
| 2015/0188399 A1 * | 7/2015 | Fukasawa ............ | H02K 41/031 310/12.11 |
| 2015/0214086 A1 * | 7/2015 | Hofmeister ....... | H01L 21/67742 414/744.5 |
| 2016/0218029 A1 * | 7/2016 | Janakiraman ..... | H01L 21/67736 |
| 2018/0076075 A1 * | 3/2018 | Janakiraman ....... | H01L 21/6776 |
| 2018/0374732 A1 * | 12/2018 | Klein ................ | H01L 21/67709 |
| 2019/0006216 A1 * | 1/2019 | Lau ................... | H01L 21/67715 |
| 2020/0017957 A1 * | 1/2020 | Zang .................... | C23C 14/562 |
| 2020/0243768 A1 * | 7/2020 | Zang ................. | H01L 21/67715 |
| 2020/0251691 A1 * | 8/2020 | Heymanns ........ | H01L 21/67712 |

* cited by examiner

APPARATUS AND METHOD FOR CONTACTLESS TRANSPORTATION OF A DEVICE IN A VACUUM PROCESSING SYSTEM

TECHNICAL FIELD

The present disclosure relates to apparatuses and methods for transportation of devices in vacuum processing systems. In particular, the present disclosure relates to apparatuses and methods for contactless transportation, particularly by magnetic levitation, in vacuum processing systems for processing substrates, particular thin flat substrates. More specifically, the present disclosure relates to apparatuses and methods for transportation of devices in vacuum processing systems which are employed for the production of optoelectronic devices, such as organic light emitting diodes (OLEDs).

BACKGROUND

Several methods are known for depositing a material on a substrate. As an example, substrates may be coated by using an evaporation process, such as a physical vapor deposition (PVD) process, a chemical vapor deposition (CVD) process, a sputtering process, a spraying process, etc. The process can be performed in a processing chamber of a deposition apparatus, where the substrate to be coated is located. A deposition material is provided in the processing chamber. A plurality of materials, such as small molecules, metals, oxides, nitrides and carbides, may be used for deposition on a substrate. Further, other processes like etching, structuring, annealing, or the like can be conducted in processing chambers.

Coated substrates may be used in several applications and in several technical fields. For instance, an application lies in the field of organic light emitting diode (OLED) panels. Further applications include insulating panels, microelectronics, such as semiconductor devices, substrates with TFT, color filters or the like.

Processing systems for display manufacturing typically include transportation systems for substrate carriers, mask carriers and processing devices, e.g. deposition sources. For example, a transportation system for substrate carriers and or mask carriers can be used to transport the respective carriers into and out of a processing chamber. Further, a transportation system for processing devices, e.g. deposition sources, is typically used to transport the processing device along the substrate while processing the substrate, e.g. by emitting material to be deposited on the substrate.

A continuing issue in systems for substrate processing is the ever-increasing demand for a higher quality of the processing result. In this respect, many challenges arise in processing systems where devices (e.g. substrate carriers, mask carriers and processing devices) are transported in the processing system In view of the above, there is a need for apparatuses, processing systems and methods which can provide for an improved control of the transportation of devices employed in processing systems for substrate processing.

SUMMARY

In light of the above, an apparatus for contactless transportation of a device in a vacuum processing system, a vacuum processing system, and a method for contactlessly transporting a device in a vacuum processing system are provided. Further aspects, benefits, and features of the present disclosure are apparent from the claims, the description, and the accompanying drawings.

According to an aspect of the present disclosure, an apparatus for contactless transportation of a device in a vacuum processing system is provided. The apparatus includes a magnetic transportation arrangement for providing a magnetic levitation force for levitating the device. The magnetic transportation arrangement includes one or more active magnetic units. The apparatus further includes a sensor for monitoring a motion of the device. Additionally, the apparatus includes a controller configured for controlling the one or more active magnetic units based on a signal provided by the sensor.

According to another aspect of the present disclosure, an apparatus for contactless transportation of a processing device in a vacuum processing system is provided. The apparatus includes a support for the processing device. The support includes one or more active magnetic units. The apparatus further includes a guiding structure extending in a transportation direction of the processing device. The one or more active magnetic units and the guiding structure are configured for providing a magnetic levitation force for levitating the processing device. Further, the apparatus includes a sensor for monitoring a motion of the processing device. Additionally, the apparatus includes a controller connected to the sensor. The controller is configured for controlling the one or more active magnetic units based on a signal provided by the sensor, such that a critical motion of the device detected the sensor is reduced.

According to yet another aspect of the present disclosure, a vacuum processing system for depositing a layer on a substrate is provided. The vacuum processing system includes a processing chamber adapted for layer deposition therein. Further, the system includes an apparatus for contactless transportation according to any embodiments described herein.

According to a further aspect of the present disclosure, a method for contactlessly transporting a device in a vacuum processing system is provided. The method includes generating an adjustable magnetic field to levitate the device. Further, the method includes monitoring a motion of the device using a sensor. Additionally, the method includes controlling the adjustable magnetic field based on a signal provided by the sensor.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
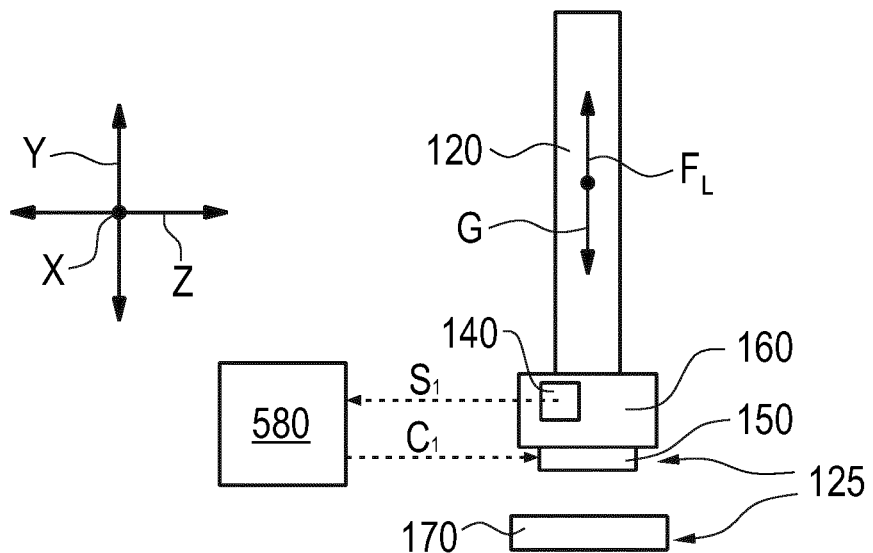
FIG. 1 shows a schematic front view of an apparatus for contactless transportation of a device according to embodiments described herein.

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Before various embodiments of the present disclosure are described in more detail, some aspects with respect to some terms and expressions used herein are explained.

In the present disclosure, an "apparatus for contactless transportation of a device" is to be understood as an apparatus configured for contactless transportation of a movable device used in a vacuum processing system. For instance, the device can be a processing device (e.g. a deposition source), a carrier for carrying a substrate, a carrier for carrying a mask, or any other movable device used in a vacuum processing system. The term "contactless" as used throughout the present disclosure can be understood in the sense that a weight of the device is not held by a mechanical contact or mechanical forces, but is held by magnetic force. Specifically, the device is held in a levitating or floating state using magnetic forces instead of mechanical forces. As an example, the apparatus described herein may have no mechanical elements, such as a mechanical rail, supporting the weight of the device during transportation. In some implementations, there can be no mechanical contact between the device and the rest of the apparatus at all during movement of the device.

The contactless transportation of the device according to embodiments described herein is beneficial in that no particles are generated due to a mechanical contact between the device and parts of the apparatus, such as mechanical rails, during transport of the device. Accordingly, a particle generation can be minimized when using the contactless transportation such that a higher quality of the processing result can be achieved.

In the present disclosure, a "magnetic transportation arrangement" is to be understood as an arrangement configured for transportation of a device employing magnetic forces. In particular, the magnetic transportation arrangement may include one or more active magnetic units configured for generating a magnetic levitation force. An "active magnetic unit" is to be understood as a magnetic unit which is adapted for generating a magnetic field, in particular an adjustable magnetic field, for providing respective magnetic levitation forces acting on the device to be levitated and/or transported. For instance, the adjustable magnetic field may be dynamically adjustable during operation of the apparatus for contactless transportation. The magnetic transportation arrangement may include a further magnetic element configured and arranged such that an interaction between the adjustable magnetic field and magnetic properties of the further magnetic element can be provided. Accordingly, a contactless levitation and/or transportation of the device may be provided, e.g. by an interaction between the adjustable magnetic field and magnetic properties of the further magnetic element.

In the present disclosure, a "sensor for monitoring a motion" is to be understood as a sensor configured for monitoring a motion of a movable device. In particular, a sensor for monitoring a motion can be understood in that the sensor is configured for detecting a motion of the movable device in some or all translational and/or rotational degrees of freedom of the movable device. In the present disclosure, the "sensor for monitoring a motion" may also be referred to as "motion sensor". For instance, the motion sensor can be an acceleration sensor configured for detecting a rate of change of velocity of a body, e.g. of a device as described herein. Accordingly, the acceleration sensor can be an accelerometer.

In the present disclosure, a "controller configured for controlling the one or more active magnetic units" is to be understood as a controller which is configured such that an adjustable magnetic field of the one or more active magnetic units can be controlled, i.e. adjusted. In particular, the controller can be in communication (e.g. by a wired or a wireless connection) with the motion sensor in order to receive a signal of the motion sensor. Further, the controller can be in communication (e.g. by a wired or a wireless connection) with the one or more active magnetic units. Further, the controller can include an algorithm (e.g. a computer program) configured such that when a critical motion of the device is detected, the controller calculates appropriate countermeasures to reduce the critical motion. Accordingly, when a critical motion of the device is detected, the controller sends a command including the appropriate countermeasures (i.e. appropriate adjustment of the adjustable magnetic field) to the one or more active magnetic units.

With exemplary reference to FIG. 1, an apparatus 100 for contactless transportation of a device 120 in a vacuum processing system is described. According to embodiments which can be combined with any other embodiments described herein, the apparatus includes a magnetic transportation arrangement 125 for providing a magnetic levitation force $F_L$ for levitating the device 120. Typically, the magnetic levitation force $F_L$ may at least partially counteract the weight G of the device 120, as exemplarily shown in FIG. 1. The magnetic transportation arrangement 125 includes one or more active magnetic units 150. Further, the magnetic transportation arrangement 125 may include a further magnetic structure 170, e.g. a guiding structure 770 as described herein. Accordingly, a contactless levitation and/or transportation of the device may be provided, e.g. by an interaction between the magnetic field and magnetic properties of the one or more active magnetic units 150 and the further magnetic structure 170.

Further, the apparatus includes a sensor 140 for monitoring a motion of the device 120. In particular, the sensor 140 for monitoring a motion of the device 120 can be configured for detecting an oscillating motion of the device 120. For example, the sensor 140 can be an acceleration sensor. For instance, the sensor 140 can be mounted or attached to the device 120. Additionally or alternatively, the sensor can be mounted or attached to a support 160 of the device 120, as exemplarily shown in FIG. 1. Additionally, the apparatus includes a controller 580 configured for controlling the one or more active magnetic units 150 based on a signal S1 provided by the sensor 140. As exemplarily shown in FIG. 1 by the dotted arrows, the sensor 140 typically provides a signal S1 to the controller. The signal S1 includes information about the motion of the device 120. The controller 580 analyzes the signal S1 and sends an appropriate control signal C1 (see dotted arrow in FIG. 1) to the one or more active magnetic units 150.

Accordingly, embodiments of the apparatus as described herein beneficially provide for the capability of reducing critical motions, e.g. oscillations or vibrations, of a movable device in a vacuum processing system. Embodiments of the apparatus as described herein may in particular be beneficial for movable devices to which a supply arrangement, e.g. a media supply structure and/or power supply structure, is connected, because an excitation of the supply structure can be reduced, particularly damped or suppressed, or even avoided. A reduction, damping, or avoidance of an excitation of the supply arrangement can in particular be beneficial since an excitation of the supply arrangement may in turn induce disturbance to the smoothness of the movement of the device to which the supply arrangement is connected. Accordingly, embodiments of the present disclosure have the advantage that the smoothness of the movement of a movable device employed in a processing system can be improved. For instance, in the case that the movable device is a deposition source assembly, a reduction or even elimination of critical motions of the deposition source assembly have the advantage that more uniform and homogeneous coating results can be obtained. Accordingly, a better processing result and thus a higher product quality, for instance of display devices such as OLEDs, can be obtained. Further, by reducing, damping, suppressing or even avoiding an excitation of the supply structure, less stress on links and connections of the elements forming the supply arrangement is induced such that the supply structure lifetime, particularly of sealings and bearings, can be prolonged.

According to embodiments which can be combined with any other embodiments described herein, the sensor 140 is configured for detecting at least one acceleration selected from the group consisting of: a translational acceleration in the x-direction, a translational acceleration in the y-direction a translational acceleration in the z-direction, a rotational acceleration around the x-direction, a rotational acceleration around the y-direction, a rotational acceleration around the z-direction, and any combination thereof.

According to embodiments which can be combined with any other embodiments described herein, two or more motion sensors (not explicitly shown) can be provided which are configured according to the senor 140 as described herein. Providing two or more sensors may in particular be beneficial for detecting a critical motion of the device with a high accuracy. For instance, the two or more motion sensors may be mounted to the device and/or to the support of the device. The two or more motion sensors can be in communication (e.g. by a wired or a wireless connection) with the controller 580, as exemplarily described with respect to the sensor 140 according to embodiments described herein.

According to embodiments which can be combined with any other embodiments described herein, the controller 580 is configured for controlling the one or more active magnetic units 150, such that a critical motion of the device 120 is reduced, particularly damped or suppressed. Accordingly, beneficially critical motions of the device 120, e.g. critical oscillations, vibration peaks, for instance at the resonance frequencies, can be attenuated. As described in more detail with reference to FIGS. 3A, 3B and 4, the one or more active magnetic units 150 may include at least one of a first active magnetic unit 741, a second active magnetic unit 742, a third active magnetic unit 747; a fourth active magnetic unit 748; a fifth active magnetic unit 749; a sixth active magnetic unit 750; and a further active magnetic unit 743.

According to embodiments which can be combined with any other embodiments described herein, the one or more active magnetic units 150 includes at least one element selected from the group consisting of: an electromagnetic device; a solenoid; a coil; a superconducting magnet; and any combination thereof.

Figure 2:
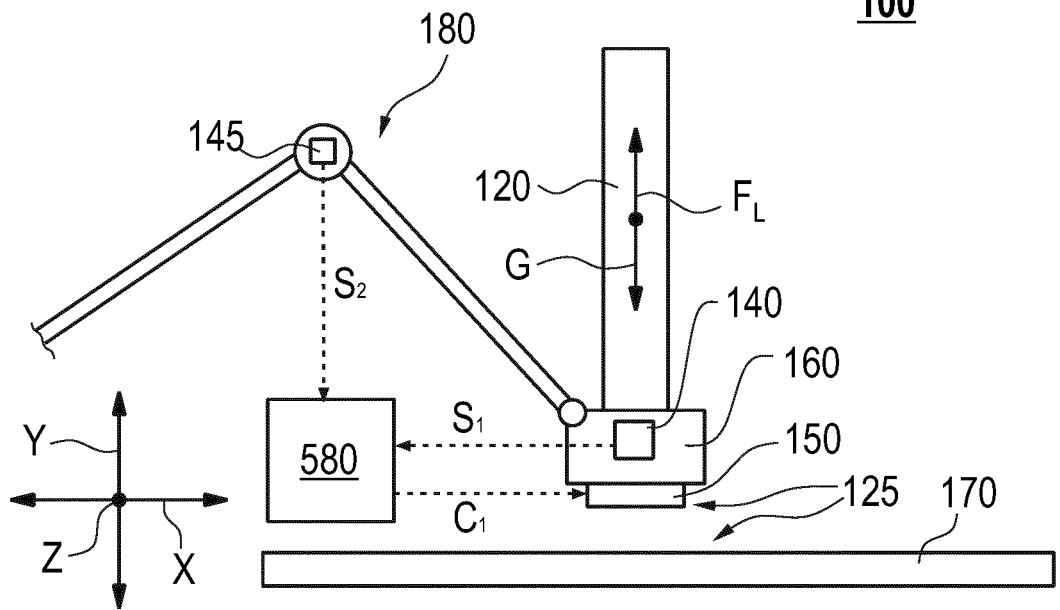
FIG. 2 shows a schematic side view of an apparatus for transportation of a device according to further embodiments described herein.

With exemplary reference to FIG. 2, according to embodiments which can be combined with any other embodiments described herein, the apparatus further includes a supply arrangement 180 connected to the device 120. For instance, the supply arrangement 180 may be configured as a feedthrough for guiding media supply lines from an environment of a vacuum chamber to the device 120, e.g. through a wall of the vacuum chamber. Accordingly, the supply arrangement 180 can include a supply passage for the media supply lines for the device 120. For example, the media supply lines may be one or more selected from the group consisting of: a supply line for electricity supply, a supply line for cooling fluids, a communication line (i.e. for transmitting signals), and other supply lines for supplying the movable device with required media or energy.

As exemplarily shown in FIG. 2, the supply arrangement 180 may include a further sensor 145 for monitoring a motion of the supply arrangement. In particular, further sensor 145 can be in communication (e.g. by a wired or a wireless connection) with the controller 580. It is to be understood that the further sensor 145 can be a motion sensor as described herein. In particular, the supply arrangement may include two or more further sensors (not explicitly shown) for monitoring a motion of the supply arrangement. Providing the supply arrangement with two or more further sensors may in particular be beneficial for detecting a critical motion of the supply arrangement with a high accuracy.

Accordingly, the controller 580 can be configured for controlling the one or more active magnetic units 150 based on a signal provided by the further sensor 145 and/or by the two or more further sensors. Further, the controller 580 can be configured for controlling the one or more active magnetic units 150 based on a signal S1 provided by the sensor 140 and/or based on a signal S2 provided by the further sensor 145, as exemplarily shown in FIG. 2 by the dotted arrows. The signal S2 provided by the further sensor 145 includes information about the motion of the supply arrangement 180. Typically, the controller 580 analyzes the signal S2 provided by the further sensor 145 and sends an appropriate control signal C1 to the one or more active magnetic units 150. The control signal C1 includes control commands to adjust the magnetic fields of the one or more active magnetic units 150, such that a critical motion of the movable device and/or the supply arrangement can be reduced, particularly damped or suppressed, or even avoided. Accordingly, beneficially a reduction, damping, or avoidance of an excitation of the supply structure can be provided which may in particular be beneficial, since an excitation of the supply structure may in turn induce disturbance to the smoothness of the movement of the device to which the supply structure is connected.

According to embodiments which can be combined with any other embodiments described herein, the device 120 is at least one device selected from the group consisting of: a processing device, a deposition source assembly, and a carrier assembly (e.g. including a substrate carrier or a mask carrier). With exemplary reference to FIGS. 3A and 3B, embodiments of the apparatus 100 for contactless transportation of a device 120 are described, in which the device is a deposition source assembly 730. With exemplary reference to FIGS. 5A and 5B, embodiments of the apparatus 100 for contactless transportation of a device 120 are described, in which the device is a carrier assembly 880, e.g. a carrier assembly including a substrate carrier and/or a mask carrier.

Figure 3A:
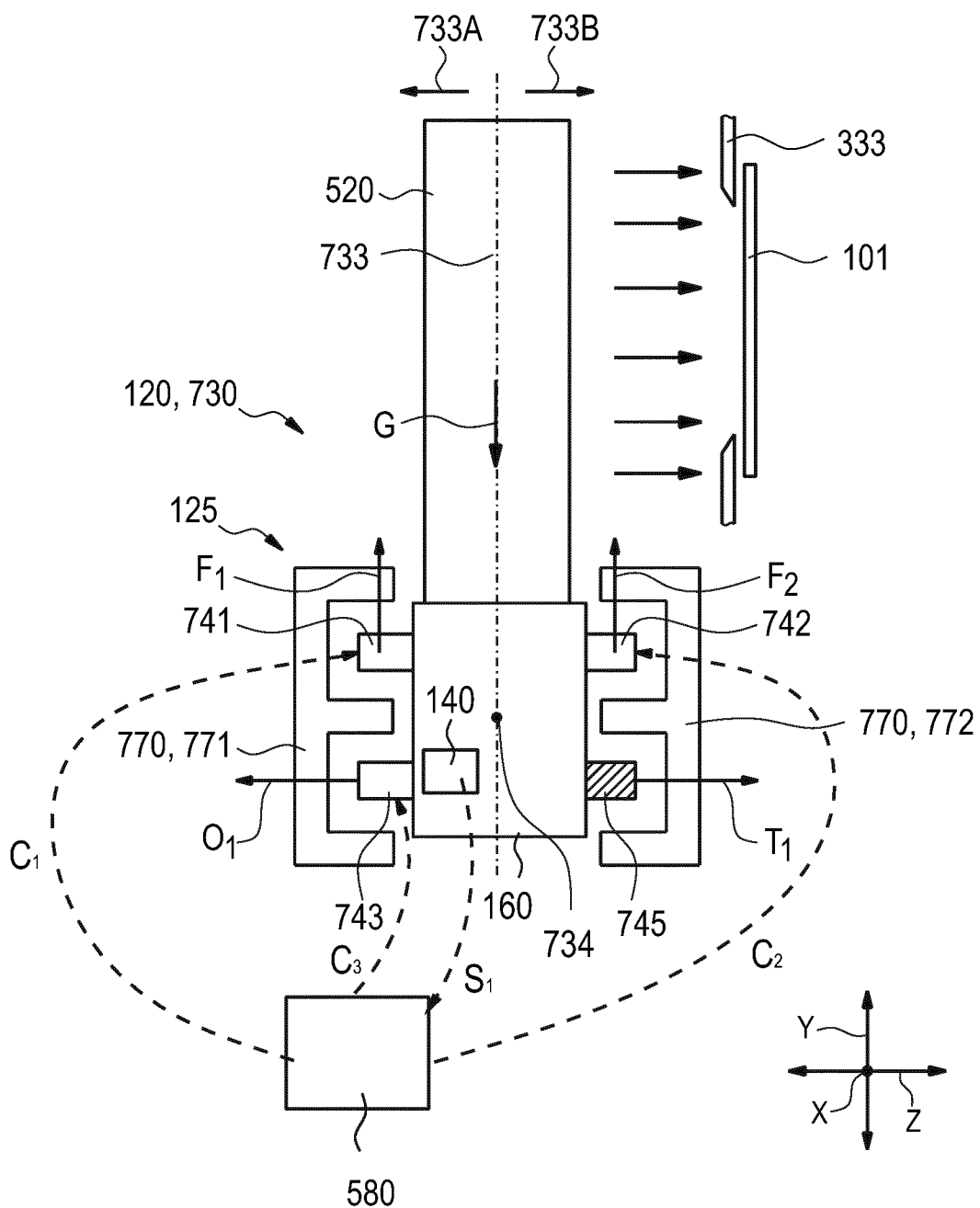
FIGS. 3A and 3B show a schematic front view of an apparatus for contactless transportation of a device according to yet further embodiments described herein.
Figure 3B:
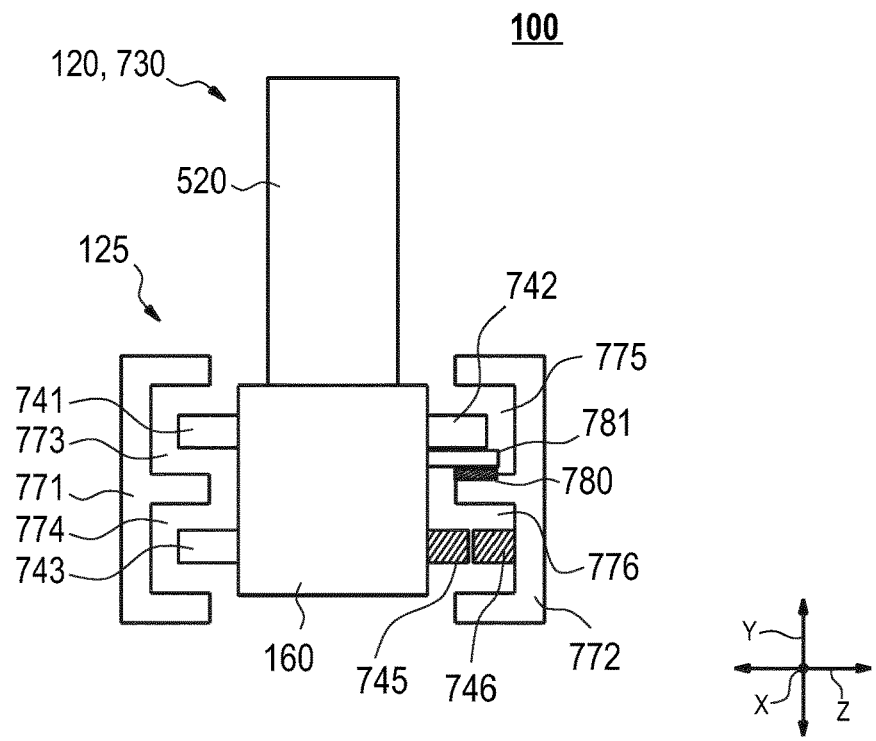

With exemplary reference to FIGS. 3A and 3B, an apparatus 100 for contactless transportation of a device 120 is described, wherein the device is a deposition source assembly 730 including a deposition source 520. In particular, as described herein, the apparatus allows for a contactless motion control of the device 120. For instance, the contactless motion control may include a control of a rotation of the device, e.g. a deposition source assembly as described in the following, with respect to one, two or three rotation axes for angularly controlling the position or orientation of the device. In particular, the apparatus may be configured for contactless rotation of the device, e.g. the deposition source assembly, around a first rotation axis, a second rotation axis and/or a third rotation axis. The first rotation axis may extend in a transversal direction, e.g. the x-direction or source transportation direction. The second rotation axis may extend in a transversal direction, e.g. the z-direction. The third rotation axis may extend in a vertical direction, e.g. the y-direction. Rotation of the deposition source assembly with respect to any rotation axis may be provided within an angle of 2° or below, e.g. from 0.1 degrees to 2 degrees or from 0.5 degrees to 2 degrees.

Some embodiments described herein involve the notion of a "vertical direction". A vertical direction is considered to be a direction substantially parallel to the direction along which the force of gravity extends. A vertical direction may deviate from exact verticality (the latter being defined by the gravitational force) by an angle of, e.g., up to 15 degrees. An essentially vertical substrate may have a deviation of +−15° or below from the vertical orientation. For example, the y-direction described herein (indicated with "Y" in the figures) is a vertical direction. In particular, the y-direction shown in the figures defines the direction of gravity.

Embodiments described herein may further involve the notion of a "transversal direction". A transversal direction is to be understood to distinguish over a vertical direction. A transversal direction may be perpendicular or substantially perpendicular to the exact vertical direction defined by gravity. For example, the x-direction and the z-direction described herein (indicated with "X" and "Z" in the figures) are transversal directions. In particular, the x-direction and the z-direction shown in the figures are perpendicular to the y-direction (and to each other). In further examples, transversal forces or opposing forces, as described herein, are considered to extend along transversal directions.

As exemplarily illustrated in FIG. 3A, the device 120 may be a deposition source assembly 730 including a deposition source 520. Further, a support 160 for supporting the device, particularly the deposition source 520, may be provided. In particular, the support 160 may be a source cart. The device, e.g. the deposition source 520 may be mounted to the support 160. As indicated by the arrows in FIG. 3A, the deposition source 520 can be adapted for emitting material for material deposition on a substrate 101. Further, as exemplarily shown in FIG. 3A, a mask 333 may be arranged between the substrate 101 and the deposition source 520. The mask 333 can be provided for preventing deposition of material emitted by the deposition source 520 on one or more regions of the substrate 101. For example, the mask 333 may be an edge exclusion shield configured for masking one or more edge regions of the substrate 101, such that no material is deposited on the one or more edge regions during the coating of the substrate 101. As another example, the mask may be a shadow mask for masking a plurality of features, which are deposited on the substrate with the material from the deposition source assembly.

According to embodiments which can be combined with any other embodiments described herein, the one or more active magnetic units 150 includes a first active magnetic unit 741 arranged at a first side of the device 120, particularly a first side of the support 160 of the device, and a second active magnetic unit 742 arranged at a second side of the device, particularly a second side of the support 160 of the device, opposite the first side of the device, particularly opposite the first side of the support. In particular, as described in the following, the first active magnetic unit and the second active magnetic unit are configured for rotating the device around a first rotation axis 734 of the device.

Further, with exemplary reference to FIG. 3A, the device, particularly the deposition source assembly 730, may include a first active magnetic unit 741 and a second active magnetic unit 742. The magnetic transportation arrangement 125 may include a guiding structure 770 extending in a device transportation direction, e.g. deposition source transportation direction. The guiding structure 770 may have a linear shape extending along the device transport direction. The length of the guiding structure 770 along the transportation direction may be from 1 m to 6 m. The first active magnetic unit 741, the second active magnetic unit 742 and the guiding structure 770 are configured for providing a first magnetic levitation force F1 and a second magnetic levitation force F2 for levitating the device 120, e.g. the deposition source assembly 730, as exemplarily indicated in FIG. 3A.

In particular, the magnetic field of the one or more active magnetic units 150, e.g. the first active magnetic unit 741 and/or the second active magnetic unit 742, may be dynamically adjustable during operation of the apparatus, for instance by the controller 580 as described herein. For example, the magnetic field may be adjustable during the emission of material by the deposition source 520 for deposition of the material on the substrate 101 and/or may be adjustable in between deposition cycles of a layer formation process. Alternatively or additionally, the magnetic field may be adjustable based on a position of the device 120, e.g. the deposition source assembly 730, with respect to the guiding structure.

According to embodiments, which can be combined with other embodiments described herein, the one or more active magnetic units 150 can be configured for generating a magnetic field for providing a magnetic levitation force extending along a vertical direction. Additionally or alternatively, the one or more active magnetic units 150 may be configured for providing a magnetic force extending along a transversal direction, e.g. an opposing magnetic force as described below. For instance, the one or more active magnetic units may be or include an element selected from the group consisting of: an electromagnetic device; a solenoid; a coil; a superconducting magnet; or any combination thereof.

As exemplarily shown in FIG. 3A, during operation of the apparatus 100, at least a portion of the guiding structure 770 may face the first active magnetic unit 741. The guiding structure 770 and/or the first active magnetic unit 741 may be arranged at least partially below the device 120, particularly the deposition source 520. In operation, the device 120, e.g. the deposition source assembly 730, is movable with respect to the guiding structure along the x-direction. Further, a position adjustment and or a motion control may be provided, e.g. by the controller 580, along the y-direction, along the z-direction and/or along an arbitrary spatial direction. The guiding structure is configured for contactless guiding of the movement of the device, e.g. the deposition source assembly. The guiding structure 770 may be a static guiding structure which can be statically arranged in a vacuum process chamber. In particular, the guiding structure 770 may have magnetic properties. For example, the guiding structure 770 may be made of a magnetic material, e.g. a ferromagnetic, particularly ferromagnetic steel. Accordingly, the guiding structure may be or include a passive magnetic unit.

The terminology of a "passive magnetic unit" is used herein to distinguish from the notion of an "active" magnetic unit or element. A passive magnetic unit or element may refer to a unit or an element with magnetic properties which are not subject to active control or adjustment. For instance, a passive magnetic unit or element may be adapted for generating a magnetic field, e.g. a static magnetic field. A passive magnetic unit or element may not be configured for generating an adjustable magnetic field. Typically, a passive magnetic unit or element may be a permanent magnet or have permanent magnetic properties.

According to embodiments, which can be combined with other embodiments described herein, the apparatus 100 may include a drive system configured for driving the device 120, e.g. the deposition source assembly 730, along the guiding structure 770. The drive system may be a magnetic drive system configured for transporting the device, particularly the deposition source assembly 730, without contact along the guiding structure 770 in the transportation direction. The drive system may be a linear motor. The drive system may be configured for starting and/or stopping movement of the device 120 along the guiding structure. According to some embodiments, which can be combined with other embodiments described herein, the contactless drive system can be a combination of a passive magnetic unit, particularly a passive magnetic unit provided at the guiding structure, and an active magnetic unit, particularly an active magnetic unit provided in or at the device, e.g. the deposition source assembly.

According to embodiments which can be combined with any other embodiments described herein, a motion control of the device, e.g. the deposition source assembly, can be conducted in real-time under the control of the controller 580. In particular, the motion control can be conducted such that critical motions, e.g. oscillations or vibrations, of the movable device are reduced, particularly damped or suppressed, or even avoided.

According to embodiments, which can be combined with other embodiments described herein, the motion control of the device may be conducted without mechanical contact. For instance, the motion control can include a vertical motion control and/or an angular motion control and/or transversal motion control, while the device is moved along the transport direction.

With exemplary reference FIG. 3A, the device 120, particularly the deposition source assembly 730, may include a first plane 733 including a first rotation axis 734 of the device 120. The device, e.g. the deposition source assembly 730, may include the first active magnetic unit 741 arranged at a first side 733A of the first plane 733 and the second active magnetic unit 742 arranged at a second side 733B of the first plane 733. The first active magnetic unit 741 and the second active magnetic unit 742 are configured for magnetically levitating the device, e.g. the deposition source assembly 730. In particular, the first active magnetic unit 741 and the second active magnetic unit 742 are each adapted for generating a magnetic field, e.g. an adjustable magnetic field, for providing respective magnetic levitation forces acting on the device 120. Accordingly, the first active magnetic unit 741 and the second active magnetic unit 742 are configured for rotating the device, particularly the deposition source assembly 730, around the first rotation axis 734 for controlling a rotational motion of the device 120.

As exemplarily shown in FIG. 3A, the first plane 733 may extend through the device 120, particularly through a body portion of the deposition source assembly 730. The first plane 733 may include the first rotation axis 734 of the device 120. According to typical embodiments, the first rotation axis 734 may extend through a center of mass of the device, e.g. the deposition source assembly 730. In operation, the first plane 733 may extend in a vertical direction. The first plane 733 may be substantially parallel or substantially perpendicular to a substrate receiving area or substrate. In operation, the first rotation axis 734 may extend along a transversal direction.

In the present disclosure, the terminology of "substantially parallel" directions may include directions which make a small angle of up to 10 degrees with each other, or even up to 15 degrees. Further, the terminology of "substantially perpendicular" directions may include directions which make an angle of less than 90 degrees with each other, e.g. at least 80 degrees or at least 75 degrees. Similar considerations apply to the notions of substantially parallel or perpendicular axes, planes, areas or the like.

As exemplarily shown in FIG. 3A, the magnetic field generated by the first active magnetic unit 741 interacts with the magnetic properties of the guiding structure 770 to provide for a first magnetic levitation force F1 acting on the device 120, particularly the deposition source assembly 730. In particular, the first magnetic levitation force F1 acts on a portion of the device 120 on the first side 733A of the first plane 733. In FIG. 3A, the first magnetic levitation force F1 is represented by a vector provided on the left-hand side of the first plane 733. According to embodiments, which can be combined with other embodiments described herein, the first magnetic levitation force F1 may at least partially counteract the weight G of the deposition source assembly 730.

The notion that a magnetic levitation force "partially" counteracts the weight G, as described herein, entails that the magnetic levitation force provides a levitation action, i.e. an upward force, on the device, e.g. the deposition source assembly, but that the magnetic levitation force alone may not suffice to levitate the device. Accordingly, the magnitude of a magnetic levitation force which partially counteracts the weight is smaller than the magnitude of the weight G.

With exemplary reference to FIG. 3A, the magnetic field generated by the second active magnetic unit 742 can interact with the magnetic properties of the guiding structure 770 to provide for a second magnetic levitation force F2 acting on the device 120, e.g. the deposition source assembly 730. In particular, the second magnetic levitation force F2 may act on a portion of the device 120 on the second side 733B of the first plane 733. In FIG. 3A, the second magnetic levitation force F2 is represented by a vector provided on the right-hand side of the first plane 733. The second magnetic levitation force F2 may at least partially counteract the weight G of the deposition source assembly.

A superposition of the first magnetic levitation force F1 and the second magnetic levitation force F2 provides for a superposed magnetic levitation force acting on the device, e.g. the deposition source assembly 730. The superposed magnetic levitation force may fully counteract the weight G of the device. The superposed magnetic levitation force may suffice to provide for a contactless levitation of the device, e.g. the deposition source assembly 730, as illustrated in FIG. 3A. Yet, further contactless forces may be provided, such that the first magnetic levitation force F1 and the second magnetic levitation force F2 provide for a superposed magnetic levitation force which may partially counteract the weight G and the first magnetic levitation force F1, the second magnetic levitation force F2, and the further contactless forces provide for a superposed magnetic levitation force to fully counteract the weight G.

According to embodiments, which can be combined with other embodiments described herein, the first active magnetic unit may be configured for generating a first adjustable magnetic field for providing a first magnetic levitation force F1. The second active magnetic unit may be configured for generating a second adjustable magnetic field for providing a second magnetic levitation force F2. As exemplarily shown in FIG. 3A, the apparatus may include a controller 580 configured for individually controlling the first active magnetic unit 741 and/or the second active magnetic unit 742 for controlling the first adjustable magnetic field and/or the second adjustable magnetic field for providing a motion control of the device, e.g. the deposition source assembly, as described herein. More specifically, the controller 580 may be configured for controlling the first active magnetic unit and the second active magnetic unit for controlling a translational motion of the device in a vertical direction. By controlling the first active magnetic unit and the second active magnetic unit by the controller as described herein, the motion of the device may be controlled such that a position of the device may be maintained in a target vertical position.

An individual control of the first active magnetic unit and/or of the second active magnetic unit may offer an additional benefit with regard to the motion control of the device, particularly the deposition source. An individual control allows for a rotation of the device, e.g. the deposition source assembly 730, around the first rotation axis 734 for providing an angular motion control. For example, with reference to FIG. 3A, individually controlling the first active magnetic unit 741 and/or the second active magnetic unit 742 in a manner such that the first magnetic levitation force F1 is greater than the second magnetic levitation force F2 results in a torque which may provide for a clockwise rotation of the device 120, e.g. the deposition source assembly 730, around the first rotation axis 734. Similarly, a second magnetic levitation force F2, which is greater than the first magnetic levitation force F1 may result in a counterclockwise rotation of the device 120 around the first rotation axis 734.

The rotational degree of freedom provided by the individual controllability of the first active magnetic unit 741 and of the second active magnetic unit 742 allows controlling an angular orientation of the device 120 with respect to the first rotation axis 734. Under the control of the controller 580, a target angular orientation and/or an angular motion control may be provided. For instance, the target angular orientation of the device, particularly the deposition source assembly, may be a vertical orientation, for example an orientation according to which the first plane 733 is parallel to the y-direction, as illustrated in FIG. 3A. Alternatively, a target orientation may be a tilted or slightly tilted orientation according to which the first plane 733 is inclined at a target angle with respect to the y-direction.

With exemplary reference to FIG. 3A, according to embodiments which can be combined with any other embodiment described herein, the apparatus 100 may include a first passive magnetic unit 745, e.g. a permanent magnet, and a further active magnet unit 743. The first passive magnetic unit 745 may be arranged at the second side 733B of the first plane 733. In operation, the first passive magnetic unit 745 may face a second portion 772 of the guiding structure 770 and/or may be provided between the first plane 733 and the second portion 772.

The further active magnetic unit 743 may be arranged at the first side 733A of the first plane 733. In operation, the further active magnetic unit 743 may face a first portion 771 of the guiding structure 770 and/or may be provided at least partially between the first plane 733 and the first portion 771. Typically, the further active magnetic unit 743 may be of a same type as the first active magnetic unit 741, as the second active magnetic unit 742. For example, the further active magnetic unit 743, the first active magnetic unit 741 and/or the second active magnetic unit 742 may be electromagnets of a same type. As compared to the first active magnetic unit 741 and the second active magnetic unit 742, the further active magnetic unit 743 may have a different spatial orientation. In particular, with respect to e.g. the first active magnetic unit 741, the further active magnetic unit 743 may be rotated, e.g. by about 90 degrees, around a transversal axis perpendicular to the drawing plane of FIG. 3A.

The further active magnetic unit 743 may be configured for generating a magnetic field, in particular an adjustable magnetic field. As exemplarily shown in FIG. 3A, the magnetic field generated by the further active magnetic unit 743 interacts with the magnetic properties of the guiding structure 770 to provide for a first opposing transversal force O1 acting on the device, particularity the deposition source assembly 730. The first opposing transversal force O1 is a magnetic force. Accordingly, the further active magnetic unit 743 and the guiding structure 770 are configured for providing a first opposing transversal force O1. The first opposing transversal force is an adjustable force counteracting a first transversal force. Further, with exemplary reference to FIG. 3A, the controller 580 may be configured for controlling the further active magnet unit 743 to provide for a transversal motion control, i.e. a control of motion in a transversal direction.

With exemplary reference to FIG. 3A, according to embodiments which can be combined with any other embodiments described herein, the first passive magnetic unit 745 and the guiding structure 770 are configured for providing a first transversal force T1. In particular, the first passive magnetic unit 745 may be configured for generating a magnetic field. The magnetic field generated by the first passive magnetic unit 745 may interact with the magnetic properties of the guiding structure 770 to provide for the first transversal force T1 acting on the device, e.g. the deposition source assembly 730. The first transversal force T1 is a magnetic force. The first transversal force T1 extends along a transversal direction, as described herein. The first transversal force T1 may extend along a direction substantially perpendicular to the transportation direction of the device. For example, the first transversal force T1 may be substantially parallel to the z-direction, as shown in FIG. 3A.

With exemplary reference to FIG. 3A, it is to be understood that the first opposing transversal force O1 extends along a transversal direction. The transversal direction may be the same as, or substantially parallel to, the transversal direction along which the first transversal force T1 extends. For example, the forces T1 and O1 shown in FIG. 3A both extend along the z-direction. In particular, the first opposing transversal force O1 and the first transversal force T1 are opposing or counteracting forces. This is illustrated in FIG. 3A by the aspect according to which the forces T1 and O1 are represented by vectors of equal lengths pointing in opposite directions along the z-direction. The first opposing transversal force O1 and the first transversal force T1 may have equal magnitudes. The first opposing transversal force O1 and the first transversal force T1 may extend in opposite directions along a transversal direction. The first transversal force T1 and the first opposing transversal force O1 may, for example, be substantially perpendicular to a substrate receiving area or substrate or a device transportation direction, particularly a deposition source transport direction.

For example, as illustrated in FIG. 3A, the first transversal force T1 may result from a magnetic attraction between the first passive magnetic unit 745 and the guiding structure 770. The magnetic attraction urges the first passive magnetic unit 745 towards the guiding structure 770, in particular towards the second portion 772 of the guiding structure 770. The first opposing transversal force O1 may result from a magnetic attraction between the further active magnetic unit 743 and the guiding structure 770. The magnetic attraction urges the further active magnetic unit 743 towards the guiding structure 770, in particular towards the first portion 771 of the guiding structure 770.

Alternatively, the first transversal force T1 may result from a magnetic repulsion between the first passive magnetic unit 745 and the guiding structure 770. The first opposing transversal force O1 may result from a magnetic repulsion between the further active magnetic unit 743 and the guiding structure 770. Also in this case, the forces T1 and O1 are counteracting forces. Accordingly, the first opposing transversal force O1 may fully counteract the first transversal force T1. The first opposing force O1 may counteract the first transversal force T1 such that the net force acting on the device, e.g. the deposition source assembly 730, along a transversal direction, e.g. the z-direction, is zero. Accordingly, the motion of the device along a transversal direction may be controlled by the controller mechanical contact.

As illustrated in FIG. 3A, the controller 580 may be configured for controlling the further active magnetic unit 743. The control of the further active magnetic unit 743 may include a control of an adjustable magnetic field generated by the further active magnetic unit 743 for controlling the first opposing transversal force O1. Controlling the further active magnetic unit 743 may allow for a motion control of the device, e.g. the deposition source 520, in a transversal direction, e.g. the z-direction.

With exemplary reference to FIG. 3A, according to embodiments which can be combined with other embodiments described herein, the first portion 771 and the second portion 772 of the guiding structure 770 may be separate parts of the guiding structure 770. In operation, the first portion 771 of the guiding structure 770 may be arranged at the first side 733A of the first plane 733. The second portion 772 of the guiding structure 770 may be arranged at the second side 733B of the first plane 733.

According to embodiments, which can be combined with other embodiments described herein, the one or more active magnetic units 150 are provided at the device, particularly at the support 160 of the device 120. For instance, one or more, or all, of the magnetic units may be mounted to the device, particularly to the support 160 of the device 120. For example, as shown in FIGS. 3A and 3B, the first active magnetic unit 741, the second active magnetic unit 742, the first passive magnetic unit 745 and/or the further active magnetic unit 743, as described herein, may be mounted to the support 160.

With exemplary reference to FIG. 3A, according to embodiments which can be combined with any other embodiment described herein, the controller 580 can be configured for controlling the first active magnetic unit 741 and/or the second active magnetic unit 742 and/or the further active magnetic unit 743 for providing a motion control of the device 120. The control signals of the controller 580 transmitted to the first active magnetic unit 741 and/or the second active magnetic unit 742 and/or the further active magnetic unit 743 are exemplarily indicated by the control signals $C_1$, $C_2$ and $C_3$. Accordingly, the controller 580 can be configured to analyze the signal S1 provided by the sensor 140 and sends an appropriate control signal to the one or more active magnetic units 150, e.g. the first active magnetic unit 741 and/or the second active magnetic unit 742 and/or the further active magnetic unit 743.

The first portion 771 and the second portion 772 of the guiding structure 770 may each be passive magnetic units and/or may include one or more passive magnet assemblies. For example, the first portion 771 and the second portion 772 may each be made of a ferromagnetic material, e.g. ferromagnetic steel. The first portion 771 may include a first recess 773 and a second recess 774. In operation, a magnetic unit, e.g. the first active magnetic unit 741 as shown in FIG. 3B, may be at least partially arranged in the first recess 773. In operation, another magnetic unit, e.g. the further active magnetic unit 743, may be at least partially arranged in the second recess 774. The first portion 771 of the guiding structure 770 may have an E-shaped profile in a cross-section perpendicular to the source transport direction, e.g. the x-direction. An E-shaped profile substantially along the length of the first portion 771 may define the first recess 773 and the second recess 774. Similarly, the second portion 772 may include a third recess 775 and a fourth recess 776. In operation, a magnetic unit, e.g. the second active magnetic unit 742 as shown in FIG. 3B, may be at least partially arranged in the third recess 775, and the first passive magnetic unit 745 may be at least partially provided in the fourth recess 776. The first passive magnetic unit 745 may interact with a further passive magnetic unit 746 provided at the guiding structure 770. The second portion 772 may have an E-shaped profile in a cross-section perpendicular to the source transportation direction. An E-shaped profile substantially along the length of the second portion 772 may define the third recess 775 and the fourth recess 776.

By arranging the magnetic units of the deposition source assembly 730 at least partially in the respective recesses of the guiding structure 770, an improved magnetic interaction between the guiding structure and the magnetic units in the respective recess is obtained for providing the forces F1, F2, T1 and/or O1 as described herein. Accordingly, an improved motion control of the device can be provided.

With exemplary reference to FIG. 3B, according to some embodiments of transportation apparatus, a passive magnetic drive unit 780 may be provided at the guiding structure. For example, the passive magnetic drive unit 780 can include a plurality of permanent magnets, particularly a plurality of permanent magnets forming a passive magnet assembly with varying pole orientation. The plurality of magnets can have alternating pole orientation to form the passive magnet assembly. An active magnetic drive unit 781 can be provided at or in the support 160. The passive magnetic drive unit 780 and the active magnetic drive unit 781 can provide the drive, e.g. a contactless drive, for movement along the guiding structure, while the source assembly is levitated.

Figure 4:
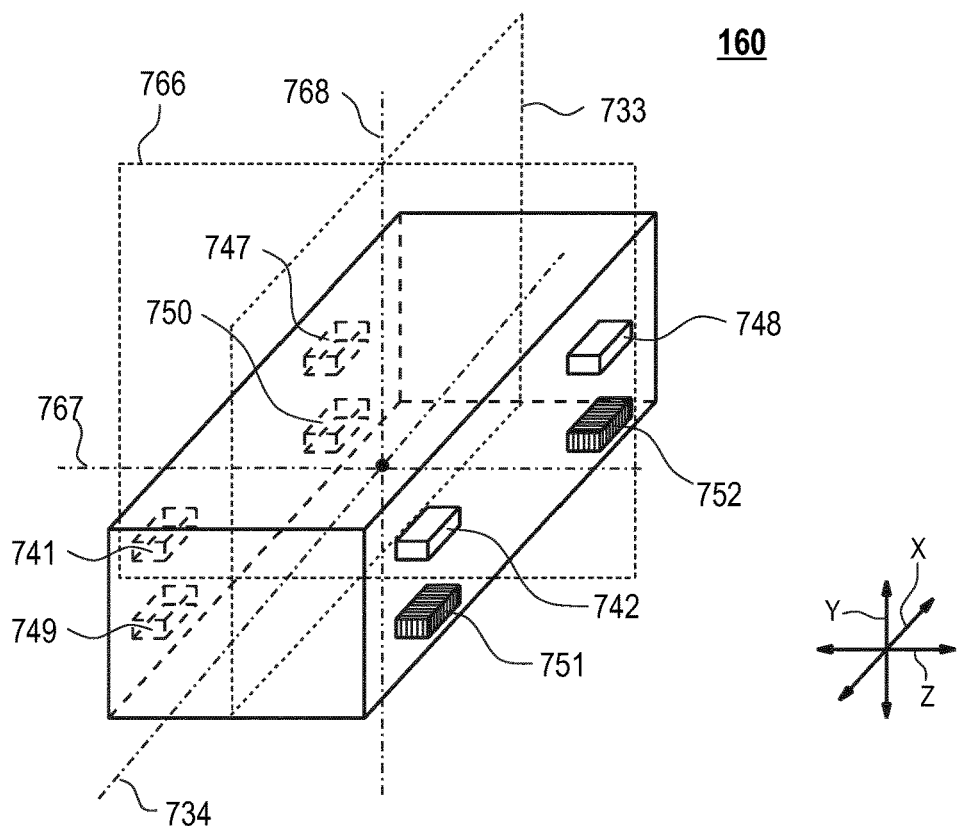
FIG. 4 shows a schematic view of an exemplary embodiment of a support for a device to be transported by an apparatus for contactless transportation according to some embodiments described herein.

FIG. 4 shows an exemplary embodiment of the support 160 for the device, e.g. a source cart for a deposition source. According to embodiments which can be combined with any other embodiments described herein, the one or more active magnetic units 150 further include a third active magnetic unit 747 at the first side of the support 160 and a fourth active magnetic unit 748 arranged at the second side of the support 160. The first active magnetic unit 741, the second active magnetic unit 742, the third active magnetic unit 747 and the fourth active magnetic unit 748 can be configured for rotating the device 120 around the first rotation axis 734 and around a second rotation axis 767 being perpendicular to the first rotation axis 734. According to a further example, which can be combined with any other embodiments described herein, the following units may be mounted to the support 160: a first active magnetic unit 741; a second active magnetic unit 742; a third active magnetic unit 747; a fourth active magnetic unit 748; a fifth active magnetic unit 749; a sixth active magnetic unit 750; a first passive magnetic unit 751; a second passive magnetic unit 752; or any combination thereof. The fifth active magnetic unit 749 may be a further active magnetic unit 743 as described with reference to FIG. 3A.

FIG. 4 shows the first plane 733, as described herein, extending through the support 160 of the device. The first plane 733 includes the first rotation axis 734, as described herein. As shown in FIG. 4, in operation, the first rotation axis 734 may be substantially parallel to the x-direction. In operation, the first rotation axis may extend along a transversal direction, e.g. substantially parallel to the x-direction. The first active magnetic unit 741, the third active magnetic unit 747, the fifth active magnetic unit 749 and/or the sixth active magnetic unit 750 may be arranged on a first side of the first plane 733. The second active magnetic unit 742, the fourth active magnetic unit 748, the first passive magnetic unit 751 and the second passive magnetic unit 752 may be arranged on a second side of the first plane 733.

Further, FIG. 4 shows a second plane 766 extending through the support 160. The second plane 766 may be perpendicular to the first plane. During operation of the apparatus 100, the second plane may extend in a vertical direction. During operation, the first plane 733 may be substantially parallel to a substrate receiving area or substrate. The second plane 766 may be substantially perpendicular to the substrate receiving area. The second plane 766 includes a second rotation axis 767 of the device, e.g. the deposition source assembly. The second rotation axis 767 may be substantially perpendicular to the first rotation axis. In operation, the second rotation axis 767 may extend along a transversal direction, e.g. substantially parallel to the z-direction, as shown in FIG. 4.

As exemplarily shown in FIG. 4, the first active magnetic unit 741, the second active magnetic unit 742, the fifth active magnetic unit 749 and/or the first passive magnetic unit 751 may be arranged on a first side of the second plane 766. The third active magnetic unit 747, the fourth active magnetic unit 748, the sixth active magnetic unit 750 and the second passive magnetic unit 752 may be arranged on a second side of the second plane 766.

In operation, the support 160 shown in FIG. 4, with the eight magnetic units mounted thereon, may be arranged with respect to a guiding structure including a first portion and a second portion having E-shaped profiles defining recesses as shown in FIG. 3B. The first active magnetic unit 741 and the third active magnetic unit 747 may be at least partially arranged in the first recess 773. The fifth active magnetic unit 749 and the sixth active magnetic unit 750 may be at least partially arranged in the second recess 774. The second active magnetic unit 742 and the fourth active magnetic unit 748 may be at least partially arranged in the third recess 775. The first passive magnetic unit 751 and the second passive magnetic unit 752 may be at least partially arranged in the fourth recess 776.

Each of the first active magnetic unit, the second active magnetic unit, the third active magnetic unit and the fourth active magnetic unit may be configured for providing a magnetic levitation force acting on the deposition source assembly. Each of these four magnetic levitation forces may partially counteract the weight of the deposition source assembly. The superposition of these four magnetic levitation forces may provide for a superposed magnetic levitation force which fully counteracts the weight of the device to be transported, such that a contactless levitation may be provided.

By controlling the first active magnetic unit, the second active magnetic unit, the third active magnetic unit and the fourth active magnetic unit by the controller 580 as described herein, the motion of the device may be controlled in a vertical direction, e.g. the y-direction.

By controlling, in particular individually controlling, the first active magnetic unit, the second active magnetic unit, the third active magnetic unit and the fourth active magnetic unit by the controller 580 as described herein, the device may be rotated around the first rotation axis and a rotational motion control around the first rotation axis can be provided. Similarly, by appropriately controlling the first active magnetic unit, the second active magnetic unit, the third active magnetic unit and the fourth active magnetic unit by the controller 580 as described herein, the device may be rotated around the second rotation axis and a rotational motion control around the second rotation axis can be provided. Accordingly, the control of the active magnetic units allows for controlling the angular orientation of the deposition source assembly with respect to the first rotation axis and the angular orientation with respect to the second rotation axis for controlling the motion of the device. Accordingly, two rotational degrees of freedom for angular motion control of the device can be provided.

With exemplary reference to FIG. 4, the first passive magnetic unit 751 and the second passive magnetic unit 752 can be configured for providing a first transversal force T1 and a second transversal force T2, respectively. The fifth active magnetic unit 749 and the sixth active magnetic unit 750 can be configured for providing a first opposing transversal force O1 and a second opposing transversal force O2, respectively. In analogy to the discussion provided with respect to FIG. 3A, the first opposing force O1 and the second opposing force O2 counteract the first transversal force T1 and the second transversal force T2.

By controlling the fifth active magnetic unit 749 and the sixth active magnetic unit 750, e.g. by the controller 580 as described herein, the forces T1 and T2 can be controlled and a motion of the device along a transversal direction, e.g. the z-direction, may be controlled. By individually controlling the fifth active magnetic unit 749 and the sixth active magnetic unit 750, the device may be rotated around a third rotation axis 768, as shown in FIG. 4. The third rotation axis 768 may be perpendicular to the first rotation axis 734 and/or may be perpendicular to the second rotation axis 767. In operation, the third rotation axis 768 may extend along a vertical direction. The individual control of the fifth active magnetic unit 749 and the sixth active magnetic unit 750 allows controlling the angular orientation of the device with respect to the third rotation axis 768 for providing an angular motion control of the device.

In view of the above, according to embodiments which can be combined with any other embodiments described herein, an apparatus for contactless transportation of a processing device, e.g. a deposition source 520, in a vacuum processing system is provided. The apparatus includes a support 160 for the processing device. The support includes one or more active magnetic units 150 as described herein. Further, the apparatus includes a guiding structure 770 extending in a transportation direction of the processing device. The one or more active magnetic units 150 and the guiding structure 770 are configured for providing a magnetic levitation force $F_L$ for levitating the processing device. Additionally, the apparatus includes a sensor 140 for monitoring a motion of the processing device. Further, the apparatus includes a controller 580 connected to the sensor. The controller is configured for controlling the one or more active magnetic units 150 based on a signal provided by the sensor 140, such that a critical motion of the device detected the sensor is reduced.

Figure 5A:
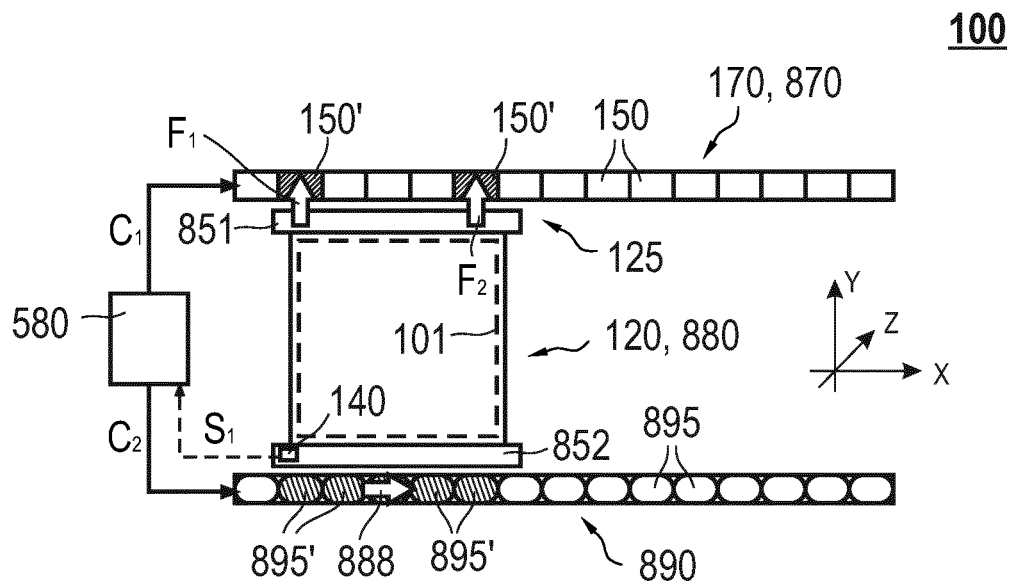
FIGS. 5A and 5B show schematic side views of an apparatus for contactless transportation of a device according to further embodiments described herein.
Figure 5B:
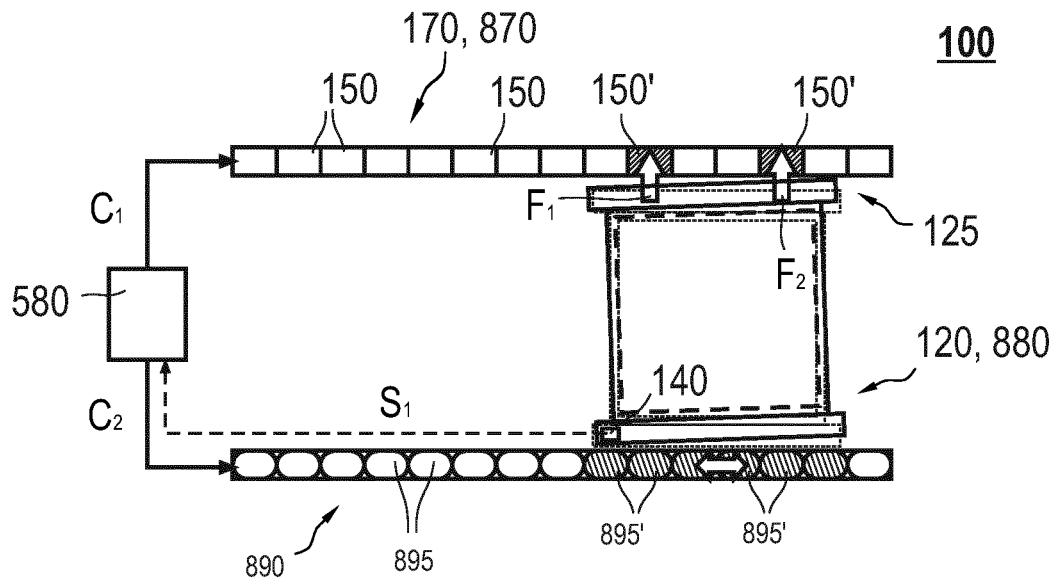

With exemplary reference to FIGS. 5A and 5B, embodiments of the apparatus 100 for contactless transportation of a device 120 are described, in which the device is a carrier assembly 880. In the present disclosure, a "carrier assembly" may include one or more elements of the group consisting of: a carrier supporting a substrate, a carrier without a substrate, a substrate, or a substrate supported by a support. Further, "carrier assembly" may include one or more elements of the group consisting of: a mask carrier supporting a mask, a carrier without a mask, a mask, or a mask supported by a support. More specifically, the carrier assembly can be configured to be held in a levitating or floating state using magnetic forces instead of mechanical forces. As an example, the apparatus 100 for contactless transportation of a carrier assembly 880 may have no mechanical elements, such as a mechanical rail, supporting the weight of the carrier assembly. In some implementations, there can be no mechanical contact between the carrier assembly and the rest of the apparatus at all during levitation, and for example movement, of the carrier assembly in the system.

According to embodiments of the present disclosure, levitating or levitation refers to a state of an object, wherein the objects floats without mechanical contact or support. Further, moving an object refers to providing a driving force, e.g. a force in a direction different from a levitation force, wherein the object is moved from one position to another, a different position, for example a different lateral position. For example, an object such as a carrier assembly can be levitated, i.e. by a force counteracting gravity, and can be moved in a direction different from a direction parallel to gravity while being levitated.

The contactless levitation, transportation and/or motion control of the carrier assembly according to embodiments described herein is beneficial in that no particles are generated due to a mechanical contact between the carrier assembly and parts of the apparatus. Accordingly, the apparatus 100 for contactless transportation of a carrier assembly 880 provides for an improved purity and uniformity of the layers deposited on the substrate, in particular since a particle generation is minimized when using the contactless levitation, transportation and/or motion control of the carrier assembly.

In particular, with exemplary reference to FIGS. 5A and 5B, the apparatus 100 for contactless transportation can be configured for a contactless translation of the carrier assembly along a vertical direction, e.g. the y-direction, and/or along one or more transversal directions, e.g. the x-direction. Further, the apparatus may be configured for a contactless rotation of the carrier assembly with respect to at least one rotation axis for providing an angular motion control of the carrier assembly. Rotation of the carrier assembly with respect to a rotation axis may be provided within an angle range from 0.003 degrees to 3 degrees.

FIG. 5A shows a front view of an exemplary embodiment of the apparatus 100 for contactless transportation of a device, particularly a carrier assembly 880. As exemplarily shown in FIGS. 5A to 5B, the apparatus 100 may include a carrier assembly 880 which can include a substrate 101 to be transported, e.g. in a substrate carrier. Alternatively, (not explicitly shown) the carrier assembly 880 can include a mask to be transported, e.g. in a mask carrier. The carrier assembly 880 typically includes a first passive magnetic element 851. As exemplarily shown in FIG. 5A, the apparatus 100 may include a further guiding structure 870 extending in a carrier assembly transportation direction, e.g. the x-direction. With exemplary reference to FIGS. 5A and 5B, the apparatus 100 may include one or more active magnetic units 150 provided at a further magnetic structure 170 of the magnetic transportation arrangement, e.g. at the further guiding structure 870, as exemplarily shown in FIGS. 5A and 5B. The further guiding structure 870 may include the one or more active magnetic units 150.

The carrier assembly 880 can be configured to be movable along the further guiding structure 870, as exemplarily indicated with the horizontal arrow 888 in FIG. 5A. The first passive magnetic element 851 and the one or more active magnetic units 150 of the further guiding structure 870 are configured for providing a first magnetic levitation force for levitating the carrier assembly 880. Further, as exemplarily shown in FIG. 5A, the apparatus 100 may include a drive structure 890. The drive structure can include a plurality of further active magnetic elements 895. The carrier assembly can include a second passive magnetic element 852, e.g. a bar of ferromagnetic material to interact with the further active magnetic elements 895 of the drive structure 890. Typically, an active magnetic unit of the plurality of the one or more active magnetic units 150 provides magnetic force interacting with the first passive magnetic element 851 of the carrier assembly 880. For example, the first passive magnetic element 851 can be a bar or a rod of a ferromagnetic material which can be a portion of the carrier assembly 880. Alternatively, first passive magnetic element may be integrally formed with a carrier. Further, as exemplarily shown in FIGS. 5A and 5B, typically the carrier assembly 880 includes a second passive magnetic element 852, for example a further bar or further rod of ferromagnetic material, which can be connected to the carrier assembly 880 or be integrally formed with the substrate support.

According to embodiments described herein, the one or more active magnetic units 150 provides for a magnetic force on the first passive magnetic element 851 and, thus, on the carrier assembly 880. Accordingly, the one or more active magnetic units 150 levitate the carrier assembly 880. Typically, the further active magnetic elements 895 are configured to drive the carrier along a carrier transport direction, for example along the X-direction shown in FIGS. 5A and 5B. Accordingly, the plurality of further active magnetic elements 895 form the drive structure for moving the carrier assembly 880 while being levitated by the one or more active magnetic units 150. The further active magnetic elements 895 interact with the second passive magnetic element 852 to provide a force along the carrier transport direction. For example, the second passive magnetic element 852 can include a plurality of permanent magnets, which are arranged with an alternating polarity. The resulting magnetic fields of the second passive magnetic element 852 can interact with the plurality of further active magnetic elements 895 to move the carrier assembly 880 while being levitated.

In order to levitate the carrier assembly 880 with one or more active magnetic units 150 and/or to move the carrier assembly 880 with the plurality of further active magnetic elements 895, the active magnetic elements can be controlled to provide adjustable magnetic fields. The adjustable magnetic field may be a static or a dynamic magnetic field. According to embodiments, which can be combined with other embodiments described herein, an active magnetic unit or element can be configured for generating a magnetic field for providing a magnetic levitation force extending in a vertical direction. According to other embodiments, which can be combined with further embodiments described herein, an active magnetic unit or element may be configured for providing a magnetic force extending along a transversal direction. An active magnetic element, as described herein, may be or include an element selected from the group consisting of: an electromagnetic device; a solenoid; a coil; a superconducting magnet; or any combination thereof.

Further, as exemplarily shown in FIGS. 5A and 5B, the apparatus 100 for contactless transportation includes a sensor 140 for monitoring a motion of the carrier assembly 880. In particular, the sensor 140 may be a motion sensor as described herein. According to embodiments which can be combined with any other embodiments described herein, two or more motion sensors (not explicitly shown) for monitoring a motion of the carrier assembly 880 can be provided. The two or more motion sensors can be configured according to the senor 140 as described herein. Further, the apparatus includes a controller 580 configured for controlling the one or more active magnetic units 150 based on a signal provided by the sensor 140 and/or the two or more motion sensors. In FIGS. 5A and 5B, a control signal provided from the controller to the one or more active magnetic units 150 is exemplarily indicated by C1.

Accordingly, the controller 580 can be configured for controlling a motion of the carrier assembly, such that a critical motion, e.g. vibrations or oscillations, of the carrier assembly is reduced, particularly damped or suppressed, or even avoided. It is to be understood that the technical principles with respect to motion control as described herein with respect to the embodiments described with respect to FIGS. 1 to 4, mutatis mutandis, can be applied to the embodiments described with respect to FIGS. 5A and 5B.

FIGS. 5A and 5B show side views of operational states of the apparatus 100 for contactless transportation of a device 120, particularly the device being a carrier assembly 880. As shown, the further guiding structure 870 may extend along a transport direction of the carrier assembly, i.e. the X-direction in FIGS. 5A and 5B. The transport direction of the carrier assembly can be a transversal direction as described herein. The further guiding structure 870 may have a linear shape extending along the transport direction. The length of the further guiding structure 870 along the source transportation direction may be from 1 to 30 m. The carrier, e.g. carrying a substrate or a mask, may be arranged substantially parallel to the drawing plane, e.g. with a deviation of +15°. For instance, the substrate may be provided in a substrate receiving area during the substrate processing, for example layer deposition process. The substrate receiving area may have dimensions, e.g. a length and a width, which are the same or slightly (e.g. 5-20%) larger than the corresponding dimensions of the substrate.

During operation of the apparatus 100 for contactless transportation, the carrier assembly 880 may be translatable along the further guiding structure 870 in the transportation direction, e.g. the x-direction. FIGS. 5A and 5B show the carrier assembly 880 at different positions along the x-direction relative to the further guiding structure 870. The horizontal arrow 888 indicates a driving force of the drive structure 890. As a result, a translation of the carrier assembly 880 from left to right along the further guiding structure 870 is provided. The vertical arrows indicate a levitation force acting on the carrier assembly.

The first passive magnetic element 851 may have magnetic properties substantially along the length of first passive magnetic element 851 in the transport direction. The magnetic field generated by the active magnetic units 150' interacts with the magnetic properties of the first passive magnetic element 851 to provide for a first magnetic levitation force $F_1$ and a second magnetic levitation force $F_2$. Accordingly, a contactless levitation, transportation, alignment and motion control of the carrier assembly 880 may be provided, particularly by sending appropriate control commands from the controller 580 to the active magnets units.

As shown in FIG. 5A, the carrier assembly 880 is provided at a first position. According to embodiments which can be combined with other embodiments described herein, two or more active magnetic units 150', for example two or three active magnetic units 150', are activated by a controller 580 to generate a magnetic field for levitating the carrier assembly 880 and/or for controlling a motion of the carrier assembly. As exemplarily shown in FIGS. 5A and 5B, typically the carrier assembly hangs below the further guiding structure 870 without mechanical contact.

In FIG. 5A, two active magnetic units 150' provide a magnetic force ($F_1$ and $F_2$), which is indicated by the vertical arrows. The magnetic forces counteract the gravity force in order to levitate the carrier assembly. The controller 580 may individually control the two active magnetic units 150' to maintain the carrier assembly in a levitating state as well as to control a motion of the carrier assembly, e.g. in the vertical direction (y-direction) and/or around a rotational axis being parallel to the z-direction. Further, one or more further active magnetic elements 895' may be controlled by the controller 580 to maintain the carrier assembly in a levitating state and/or to control a motion of the carrier assembly, e.g. in the vertical direction (y-direction) and/or around a rotational axis being parallel to the z-direction. In FIGS. 5A and 5B, a control signal provided by the controller 580 to the one or more further active magnetic elements 895' is exemplarily indicated by $C_2$. The further active magnetic elements 895' interact with the second passive magnetic element 852, for example a set of alternating permanent magnets, to generate a driving force indicated by the horizontal arrow 888. The driving force moves the carrier assembly in the transport direction. As shown in FIG. 5A, the transport direction can be the X-direction. According to some embodiments of the present disclosure, which can be combined with other embodiments described herein, the number of further active magnetic elements 895', which are simultaneously controlled to provide the driving force, is 1 to 3.

According to embodiments which can be combined with any other embodiments described herein, the carrier assembly 880 may be provided with two or more motion sensors (not explicitly shown), which are configured according to the sensor 140 as described herein. Providing two or more motions sensors may in particular be beneficial for detecting a critical motion of the carrier assembly 880 with a high accuracy.

From FIGS. 5A and 5B, it is to be understood that at a first position, the carrier assembly is positioned below the first group of active magnetic units and at a further, different position, the carrier assembly is positioned below the further, different group of active magnetic units. The controller controls which active magnetic element provides a levitation force for a respective position and controls the respective active magnetic elements to levitate the carrier assembly and/or for controlling a motion of the carrier assembly.

FIG. 5B shows the carrier assembly in a second position. In the second position, two active magnetic units 150' provide a first magnetic force $F_1$ indicated by the left vertical arrow and a second magnetic force $F_2$ indicated by right vertical arrow. The controller 580 controls the two active magnetic units 150' to provide for an alignment and/or a motion control in a translational direction, particularly a vertical direction, for example the Y-direction in FIG. 5B. Further, additionally or alternatively, the controller 580 may control the two active magnetic units 150' to provide for an alignment or motion control, wherein the carrier assembly is rotated in the X-Y-plane, e.g. around a rotation axis parallel to the z-direction. Both movements, i.e. rotational and translational, can exemplarily be seen in FIG. 5B by comparing the position of the dotted carrier assembly and the position of the carrier assembly 880 drawn with solid lines.

Accordingly, the controller 580 may be configured for controlling the active magnetic units 150' for providing a translational motion control of the carrier assembly, e.g. in a vertical direction. Further, the controller can be configured for controlling the active magnetic units 150' for providing an angular motion control, e.g. around a rotational axis extending parallel to z-direction.

According to embodiments which can be combined with any other embodiments described herein, the apparatus 100 for contactless transportation can be configured for providing a motion control, particularly a contactless motion control, of the carrier assembly in a translational direction, e.g. a vertical direction (y-direction), with an accuracy of 50 μm or below, for example 1 μm to 10 μm, such as 5 μm. According to embodiments of the present disclosure, a rotational alignment precision, particularly a contactless alignment precision, can be 3° or below, particularly 1° or below. Further, the apparatus 100 can be configured for providing a motion control, particularly a contactless motion control, of the carrier assembly in the transport direction, e.g. a horizontal direction (x-direction), with an accuracy of 50 μm or below, for example 1 μm to 10 μm, such as 5 μm.

Accordingly, embodiments of the present disclosure have the advantage that the smoothness of the movement of a movable device employed in a processing system can be improved. For instance, in the case that the movable device is a carrier assembly, a reduction or even elimination of critical motions of the carrier assembly have the advantage that more uniform and homogeneous coating results can be obtained. Accordingly, a better processing result and thus a higher quality product quality, for instance of display devices such as OLEDs, can be obtained.

Figure 6:
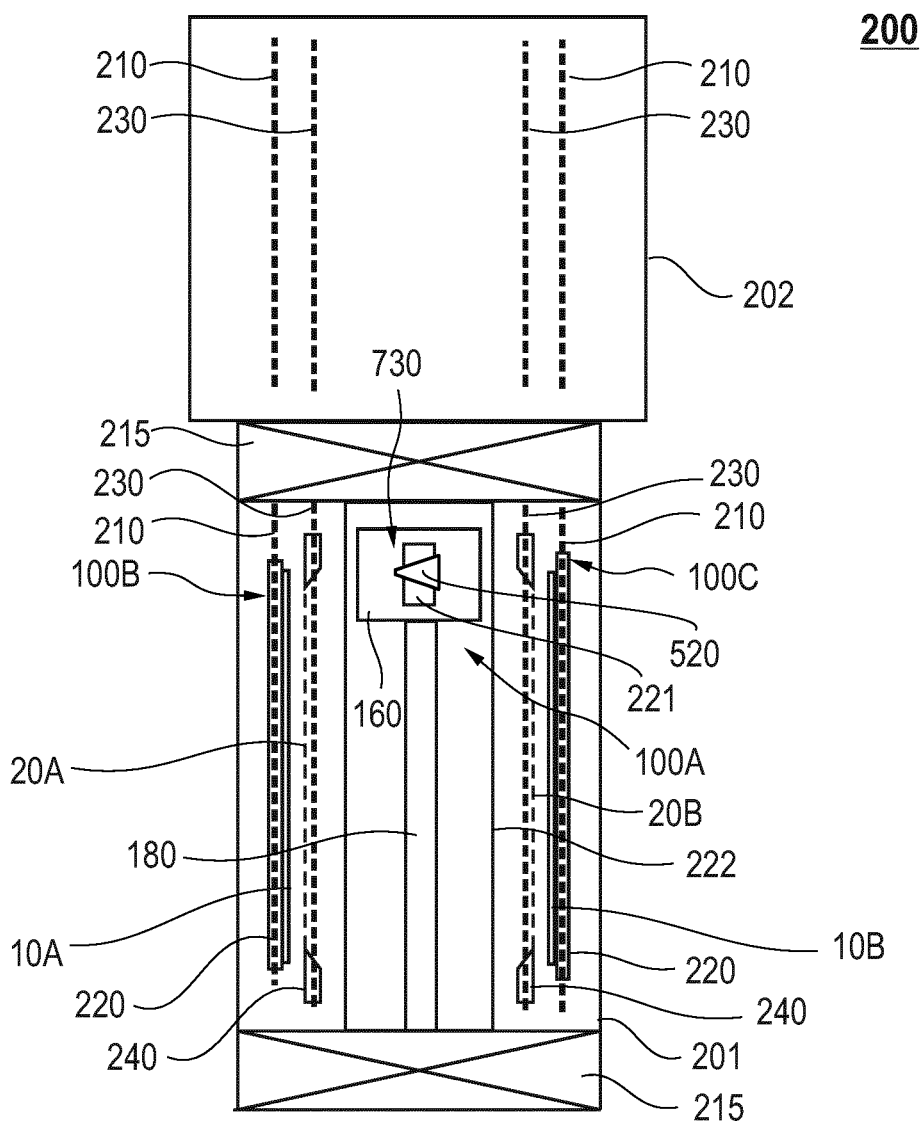
FIG. 6 shows a schematic view of a vacuum processing system according to embodiments described herein.

With exemplary reference to FIG. 6, vacuum processing system 200 for processing a substrate is described. According to embodiments which can be combined with any other embodiments described herein, the vacuum processing system includes a processing chamber 201 adapted for processing the substrate therein. Further, the vacuum processing system includes an apparatus 100 for contactless transportation according to any embodiments described herein. Accordingly, by providing a vacuum processing system 200 with an apparatus 100 for contactless transportation according to any embodiments described herein, an improved vacuum processing system is provided with which an improved processing result can be obtained, e.g. in the production of display devices such as OLEDs.

In the exemplary embodiment shown in FIG. 6, the vacuum processing system 200 includes three apparatuses for contactless transportation as described herein. In particular, a first apparatus 100A for contactless transportation of a deposition source assembly 730 is provided. Additionally, a second apparatus 100B and a third apparatus 100C for contactless transportation of a carrier assembly can be provided.

According to embodiments which can be combined with any other embodiments described herein, the vacuum processing system 200 further includes a substrate carrier 220 for carrying a substrate as described herein. In some implementations, a first track arrangement 210 is provided which is configured for transportation of the substrate carrier 220. Further, a second track arrangement 230 can be provided which is configured for transportation of a mask carrier 240.

According to some embodiments, which can be combined with any other embodiments described herein, the processing chamber 201 is a vacuum chamber (e.g. a vacuum processing chamber, particularly a vacuum deposition chamber. The term "vacuum", as used herein, can be understood in the sense of a technical vacuum having a vacuum pressure of less than, for example, 10 mbar. Typically, the pressure in a vacuum chamber as described herein may be between $10^{-5}$ mbar and about $10^{-8}$ mbar, more typically between $10^{-5}$ mbar and $10^{-7}$ mbar, and even more typically between about $10^{-6}$ mbar and about $10^{-7}$ mbar. According to some embodiments, the pressure in the vacuum chamber may be considered to be either a partial pressure of an evaporated material within the vacuum chamber or the total pressure (which may approximately be the same when only the evaporated material is present as a component to be deposited in the vacuum chamber). In some embodiments, the total pressure in the vacuum chamber may range from about $10^{-4}$ mbar to about $10^{-7}$ mbar, especially in the case that a second component besides the evaporated material is present in the vacuum chamber (such as a gas or the like).

Further, as exemplarily shown in FIG. 6, the apparatus can include at least one further chamber 202 having a transport arrangement. The at least one further chamber 202 can be a rotation module, a transit module, or a combination thereof.

As exemplarily shown in FIG. 6, a deposition source assembly 730 can be provided in the processing chamber 201. The deposition source assembly 730 can be provided on a track or linear guide 222. The linear guide 222 may be configured for translational movement of the deposition source assembly 730. Further, a drive for providing a translational movement of the deposition source assembly 730 can be provided. In particular, an apparatus for contactless transportation of the deposition source assembly 730 may be provided.

With exemplary reference to FIG. 6, according to embodiments which can be combined with any other embodiments described herein, the deposition source assembly 730 may include support 160, e.g. a source cart, which supports an evaporation crucible 221 and a deposition source 520 having a distribution assembly. The support 160 can be configured for the translational movement of the deposition source assembly 730 along the linear guide 222. The source cart can support the evaporation crucible 221 and a distribution assembly provided over the evaporation crucible 221. Accordingly, the vapor generated in the evaporation crucible 221 can move upwardly and out of the one or more outlets of the distribution assembly. Thus, the distribution assembly is configured for providing evaporated organic material, particularly a plume of evaporated source material, from the distribution assembly to the substrate.

As exemplarily shown in FIG. 6, the processing chamber 201 may have gate valves 215 via which the vacuum processing chamber can be connected to an adjacent further chamber 202, e.g. a routing module or an adjacent service module. In particular, the gate valves 215 allow for a vacuum seal to the adjacent further chamber and can be opened and closed for moving a substrate and/or a mask into or out of the vacuum processing chamber.

With exemplary reference to FIG. 6, according to embodiments which can be combined with any other embodiments described herein, two substrates, e.g. a first substrate 10A and a second substrate 10B, can be supported on respective transportation tracks, such as respective first track arrangements 210 as described herein. Further, two tracks, e.g. two second track arrangements 220 as described herein, for providing carriers can be provided. In particular, the tracks for transportation of a substrate carrier and/or a mask carrier may be configured for contactless transportation as described herein with exemplary reference to FIGS. 5A and 5B.

According to embodiments which can be combined with any other embodiments described herein, coating of the substrates may include masking the substrates by respective masks, e.g. by an edge exclusion mask or by a shadow mask. According to some embodiments, the masks, e.g. a first mask 20A corresponding to the first substrate 10A and a second mask 20B corresponding to the second substrate 10B, are provided in respective mask arrangements to hold the masks, e.g. the first mask 20A and the second mask 20B in a predetermined position, as exemplarily shown in FIG. 6.

According to some embodiments, which can be combined with other embodiments described herein, the substrate is supported by the substrate carrier 220, which can be connected to an alignment system as described herein (not shown in FIG. 6). The alignment system can be configured for adjusting the position of the substrate with respect to the mask. It is to be understood that the substrate can be moved relative to the mask in order to provide for a proper alignment between the substrate and the mask during deposition of the organic material. According to a further embodiment, which can be combined with other embodiments described herein, alternatively or additionally the mask carrier holding the mask frame can be connected to the alignment system. According to a yet further embodiment, which can be combined with other embodiments described herein, alternatively or additionally the mask frame holding the mask can be connected to the alignment system. Accordingly, either the mask can be positioned relative to the substrate or the mask and the substrate can both be positioned relative to each other. An alignment system as described herein may allow for a proper alignment of the masking during the deposition process, which is beneficial for high quality or OLED display manufacturing.

According to embodiments, which can be combined with any other embodiments described herein, the vacuum processing system is configured for processing of large area substrates. For example, a "large area substrate" as described herein can have a size of at least 0.01 m2, specifically at least 0.1 m2, and more specifically at least 0.5 m2. For instance, a large area substrate or carrier can be GEN 4.5, which corresponds to about 0.67 $m^2$ substrates (0.73×0.92 m), GEN 5, which corresponds to about 1.4 $m^2$ substrates (1.1 m×1.3 m), GEN 7.5, which corresponds to about 4.29 $m^2$ substrates (1.95 m×2.2 m), GEN 8.5, which corresponds to about 5.7 $m^2$ substrates (2.2 m×2.5 m), or even GEN 10, which corresponds to about 8.7 $m^2$ substrates (2.85 m×3.05 m). Even larger generations such as GEN 11 and GEN 12 and corresponding substrate areas can similarly be implemented. Accordingly, the substrate can be selected from the group consisting of GEN 1, GEN 2, GEN 3, GEN 3.5, GEN 4, GEN 4.5, GEN 5, GEN 6, GEN 7, GEN 7.5, GEN 8, GEN 8.5, GEN 10, GEN 11, and GEN 12. In particular, the substrate can be selected from the group consisting of GEN 4.5, GEN 5, GEN 7.5, GEN 8.5, GEN 10, GEN 11, and GEN 12, or a larger generation substrate. Further, the substrate thickness can be from 0.1 to 1.8 mm, particularly about 0.9 mm or below, such as 0.7 mm or 0.5.

In the present disclosure, the term "substrate" or "large area substrate" as used herein shall particularly embrace inflexible substrates, e.g., glass plates and metal plates. However, the present disclosure is not limited thereto, and the term "substrate" can also embrace flexible substrates such as a web or a foil. According to some embodiments, the substrate can be made of any material suitable for material deposition. For instance, the substrate can be made of a material selected from the group consisting of glass (for instance soda-lime glass, borosilicate glass etc.), metal, polymer, ceramic, compound materials, carbon fiber materials, mica or any other material or combination of materials which can be coated by a deposition process.

According to embodiments which can be combined with any other embodiments described herein, the vacuum processing system is configured for vertical substrate processing. The expression "vertical substrate processing" can be understood in that the apparatus is configured for processing a substrate in a substantially vertical orientation (substantially vertical=vertical+−15°. As used throughout the present disclosure, terms like "vertical direction" or "vertical orientation" are understood to distinguish over "horizontal direction" or "horizontal orientation".

Figure 7:
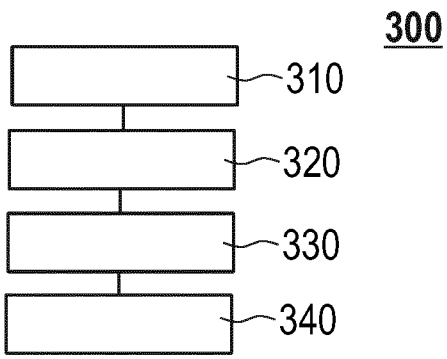
FIG. 7 shows a flowchart for illustrating a method for contactlessly transporting a device in a vacuum processing system according to embodiments described herein.

With exemplary reference to FIG. 7, a method 300 for contactlessly transporting a device in a vacuum processing system is described. The method includes generating (block 310) an adjustable magnetic field to levitate the device; monitoring (block 320) a motion of the device using a sensor; and controlling (block 330) the adjustable magnetic field based on a signal provided by the sensor. In particular, the method 300 for contactlessly transporting a device includes employing an apparatus 100 for contactless transportation according to embodiments described herein.

According to embodiments which can be combined with any other embodiments described herein, the method 300 further includes monitoring (block 340) a motion of a supply arrangement connected to the device using a further sensor.

According to embodiments which can be combined with any other embodiments described herein, controlling (block 330) of the adjustable magnetic field includes regulating the adjustable magnetic field such that a detected critical motion of the device is reduced, particularly damped or suppressed.

It is to be understood that the features as described with respect to the embodiments of the apparatus 100 for contactless transportation as exemplarily described with reference to FIGS. 1 to 5B, can also be applied to the method 300 for contactlessly transporting a device as described herein. The embodiments of the methods described herein can be performed using any of the embodiments of the apparatuses described herein. Conversely, the embodiments of the apparatuses described herein are adapted for performing any of the embodiments of the methods described herein.

In view of the above, it is to be understood that embodiments as described herein beneficially provide for improved apparatuses, processing systems and methods which can provide for an improved control of the transportation of devices employed in processing systems for substrate processing.

In particular, embodiments as described herein beneficially provide for the capability of reducing critical motions, e.g. oscillations or vibrations, of a movable device in a vacuum processing system. For instance, embodiments as described herein may in particular be beneficial for movable devices to which a supply arrangement, e.g. a media supply structure and/or power supply structure, is connected, because an excitation of the supply structure can be reduced, particularly damped or suppressed, or even avoided. A reduction, damping, or avoidance of an excitation of the supply structure can in particular be beneficial since an excitation of the supply arrangement may in turn induce disturbance to the smoothness of the movement of the device to which the supply arrangement is connected. Accordingly, embodiments of the present disclosure have the advantage that the smoothness of the movement of a movable device employed in a processing system can be improved. For instance, in the case that the movable device is a deposition source assembly, a reduction or even elimination of critical motions of the deposition source assembly have the advantage that more uniform and homogeneous coating results can be obtained. Accordingly, a better processing result and thus a higher quality product quality, for instance of display devices such as OLEDs can be obtained. Further, by reducing, damping, or even avoiding an excitation of the supply structure, less stress on links and connections of the elements forming the supply structure is induced such that the supply structure lifetime, particularly of sealings and bearings, can be prolonged.

While the foregoing is directed to embodiments of the disclosure, other and further embodiments of the disclosure may be devised without departing from the basic scope thereof, and the scope thereof is determined by the claims that follow.

In particular, this written description uses examples to disclose the disclosure, including the best mode, and also to enable any person skilled in the art to practice the described subject-matter, including making and using any devices or systems and performing any incorporated methods. While various specific embodiments have been disclosed in the foregoing, mutually non-exclusive features of the embodiments described above may be combined with each other. The patentable scope is defined by the claims, and other examples are intended to be within the scope of the claims if the claims have structural elements that do not differ from the literal language of the claims, or if the claims include equivalent structural elements with insubstantial differences from the literal language of the claims.

The invention claimed is:

1. An apparatus for contactless transportation of a device in a vacuum processing system, the apparatus comprising:
   a magnetic transportation arrangement for providing a magnetic levitation force ($F_L$) for levitating the device, the magnetic transportation arrangement comprising one or more active magnetic units;
   a sensor for monitoring a motion of the device;
      a supply arrangement connected to the device, the supply arrangement providing a media supply or power supply to the device; and
   a controller configured for controlling the one or more active magnetic units based on a signal provided by the sensor.

2. The apparatus according to claim 1, wherein the sensor is an acceleration sensor.

3. The apparatus according to claim 1, wherein the sensor is mounted to the device.

4. The apparatus according to claim 1, wherein the controller is configured for controlling the one or more active magnetic units such that a critical motion of the device is reduced.

5. The apparatus according to claim 1, wherein the one or more active magnetic units comprises at least one element selected from the group consisting of: an electromagnetic device; a solenoid; a coil; a superconducting magnet; and any combination thereof.

6. The apparatus according to claim 1, wherein the one or more active magnetic units is provided at a guiding structure of the magnetic transportation arrangement.

7. The apparatus according to claim 1, wherein the sensor is mounted to a support of the device.

8. The apparatus according to claim 1, wherein the one or more active magnetic units is provided at a support for the device.

9. The apparatus according to claim 1, wherein the device is at least one device selected from the group consisting of: a processing device, a deposition source assembly, and a carrier assembly.

10. The apparatus according to claim 9, the supply structure comprising a further sensor for monitoring a motion of the supply arrangement.

11. The apparatus according to claim 1, wherein the one or more active magnetic units is provided at the device.

12. The apparatus according to claim 11, wherein the one or more active magnetic units comprises a first active magnetic unit arranged at a first side of the device and a second active magnetic unit arranged at a second side of the device opposite the first side of the support, wherein the first active magnetic unit and the second active magnetic unit are configured for rotating the device around a first rotation axis of the device.

13. The apparatus according to claim 12, wherein the one or more active magnetic units further comprises a third active magnetic unit at the first side of the support and a fourth active magnetic unit arranged at the second side of the support, wherein the first active magnetic unit, the second active magnetic unit, the third active magnetic unit and the fourth active magnetic unit are configured for rotating the device around the first rotation axis and around a second rotation axis being perpendicular to the first rotation axis.

14. The apparatus according to claim 1, comprising a further sensor for monitoring a motion of the supply arrangement.

15. The apparatus according to claim 14, wherein the controller is configured for controlling the one or more active magnetic units based on a signal provided by the further sensor.

16. An apparatus for contactless transportation of a processing device in a vacuum processing system, the apparatus comprising:
 a support) for the processing device, the support comprising one or more active magnetic units;
 a guiding structure extending in a transportation direction of the processing device, wherein the one or more active magnetic units and the guiding structure are configured for providing a magnetic levitation force ($F_L$) for levitating the processing device;
 a sensor for monitoring a motion of the processing device:
  a supply arrangement connected to the processing device, the supply arrangement providing a media supply or power supply to the device; and
 a controller connected to the sensor, wherein the controller is configured for controlling the one or more active magnetic units based on a signal provided by the sensor such that a critical motion of the device detected by the sensor is reduced.

17. A vacuum processing system for processing a substrate, the vacuum processing system comprising:
 a processing chamber adapted for processing the substrate therein; and
 an apparatus for contactless transportation of a device in a vacuum processing system, the apparatus comprising:
 a magnetic transportation arrangement for providing a magnetic levitation force ($F_L$) for levitating the device, the magnetic transportation arrangement comprising one or more active magnetic units;
 a sensor for monitoring a motion of the device;
 a supply arrangement connected to the device, the supply arrangement providing a media supply or power supply to the device; and
 a controller configured for controlling the one or more active magnetic units based on a signal provided by the sensor.

18. A method for contactlessly transporting a device in a vacuum processing system, the method comprising:
 generating an adjustable magnetic field to levitate the device, the device being connected to a supply arrangement, the supply arrangement providing a media supply or power supply to the device;
 monitoring a motion of the device using a sensor; and
 controlling the adjustable magnetic field based on a signal provided by the sensor.

19. The method of claim 18, further comprising monitoring a motion of the supply arrangement connected to the device using a further sensor.

20. The method of claim 18, wherein controlling of the adjustable magnetic field comprises regulating the adjustable magnetic field such that a detected critical motion of the device is reduced.

* * * * *